United States Patent [19]

Matsuzawa et al.

[11] 3,982,188
[45] Sept. 21, 1976

[54] STATION SELECTING DEVICE HAVING IMPROVED NOISE DISCRIMINATION CIRCUITRY

[75] Inventors: Mitsuo Matsuzawa; Kaoru Mitarai, both of Tokyo, Japan

[73] Assignee: Trio Electronics Incorporated, Tokyo, Japan

[22] Filed: Nov. 14, 1974

[21] Appl. No.: 523,862

[30] Foreign Application Priority Data

June 18, 1974 Japan.............................. 49-69557

[52] U.S. Cl................................. 325/470; 325/25; 325/65; 325/473
[51] Int. Cl.²............................................ H04B 1/32
[58] Field of Search................................ 325/18–21, 325/26, 25, 31, 457–459, 464, 468–470, 473, 65

[56] References Cited
UNITED STATES PATENTS

| | | | |
|---|---|---|---|
| 3,821,651 | 6/1974 | Fathauer et al. | 325/470 |
| 3,835,384 | 9/1974 | Liff | 325/25 |

*Primary Examiner*—Robert L. Griffin
*Assistant Examiner*—Jin F. Ng
*Attorney, Agent, or Firm*—Gerald J. Ferguson, Jr.; Joseph J. Baker

[57] ABSTRACT

A multi-channel communication system including automatic station selecting circuitry and circuitry for preventing actuation of the station selection circuitry by noise or the like. The station selecting circuitry automatically, sequentially generates a plurality of local oscillator signals which are mixed with incoming information signals transmitted in one or more of the channels of the system. Whenever the frequency difference between an information signal and a local oscillator signal falls within the pass band of the receiving channel, a sensing signal is generated which stops the automatic station selector so that communications can occur on the selected channel. Circuitry is also employed to discriminate between noise and an appropriate information signal in the receiving channel so that the above-mentioned sensing signals are generated only when information signals are present.

2 Claims, 4 Drawing Figures

STATION SELECTING DEVICE HAVING IMPROVED NOISE DISCRIMINATION CIRCUITRY

CROSS REFERENCE TO RELATED APPLICATION

This application is related to a copending patent application Ser. No. 523,860 entitled "Station Selecting Device Having Improved Monitor" filed on instant date herewith by the inventors of the subject application and assigned to the assignee thereof, the foregoing application being incorporated herein by reference.

BACKGROUND OF THE INVENTION

This invention relates to a station selecting device employing an improved signal discriminating method and apparatus for use in a communication transmitter-receiver, a broadcasting receiver, and the like where the receiver, for example, is provided with an automatic station selecting device.

Recently, the number of communication stations utilizing transmitting-and-receiving apparatus and the like has increased significantly, particularly in the 2 m band. Thus, it has sometimes been difficult to find vacant channels in the ordinary communication or to find an opposite station in a substantially less-crowded band or in a special time period such as around midnight. Furthermore, difficulties have been experienced with radio broadcasting receivers and particularly automobile radio receivers, where it is comparatively difficult to select stations, the number of which has been thus increased.

To avoid these inconveniences, some transmitter-receivers have recently been equipped with an automatic station selecting device having so-called autoscanning and autotuning functions which sweep, normally during signal reception, the channels or stations to automatically select and transfer the channels. In the automatic station selecting device, the automatic sweeping and stopping are controlled by detecting or discriminating the existence or nonexistence of a sensing signal in the desired channel and tuning is effected thereafter. However, in conventional methods and circuits, the discrimination has been effected by applying, for example, a switching pulse and a squelch signal output to a NAND gate. This, in turn, has resulted in the possibility of erroneous operation by a random noise signal.

SUMMARY OF THE INVENTION

The present invention provides a station selecting device having an improved signal discriminating circuit wherein a noise signal is discriminated from a sensing signal to prevent erroneous tuning operations.

This and other objects of the invention will become apparent from a reading of the specification and claims taken with the drawing.

DETAILED DESCRIPTION OF THE PREFERRED EMBODIMENTS

Figure 1:
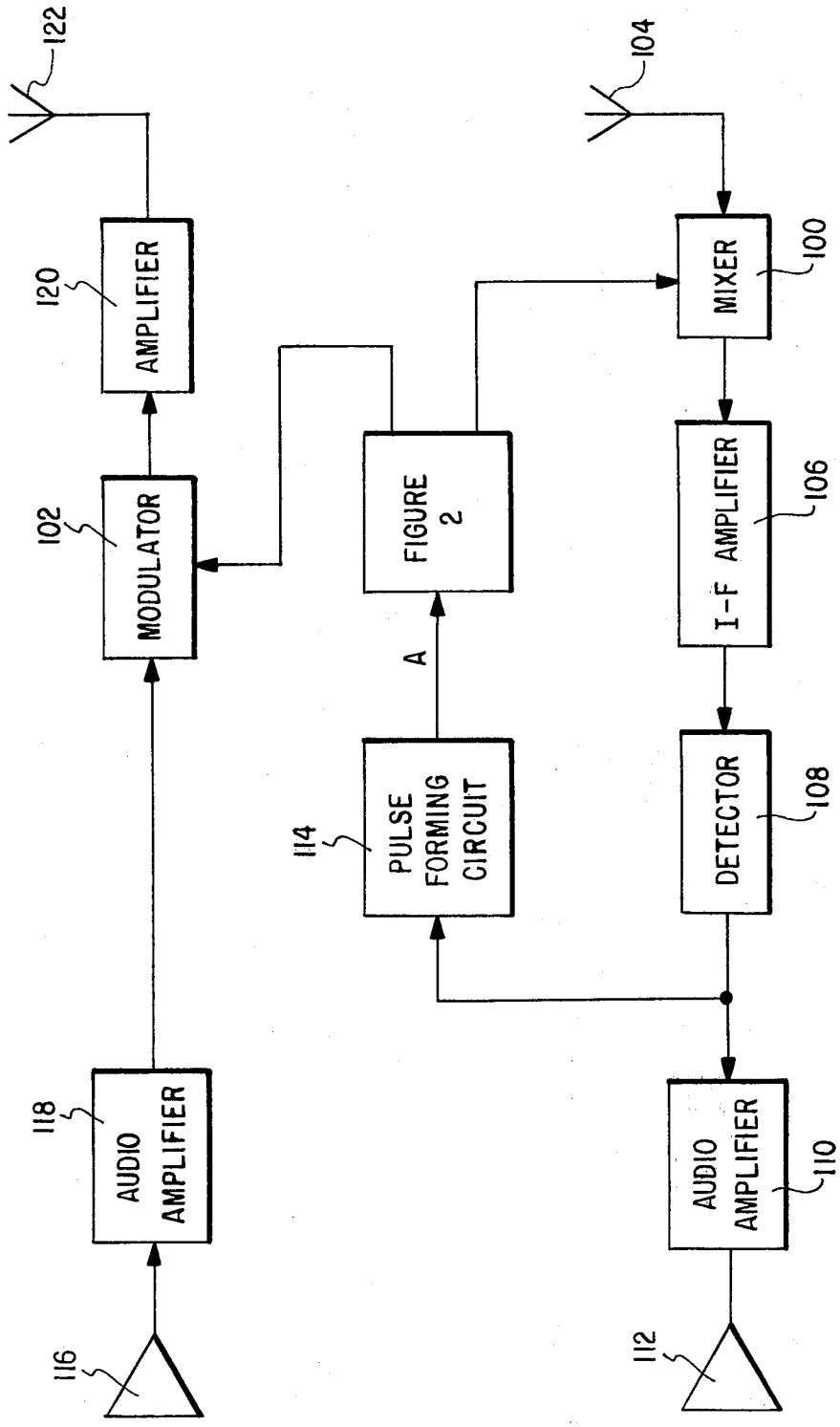
FIG. 1 is an illustrative block diagram of a typical overall system in which the signal discriminating method and apparatus of this invention may be used.
Figure 2:
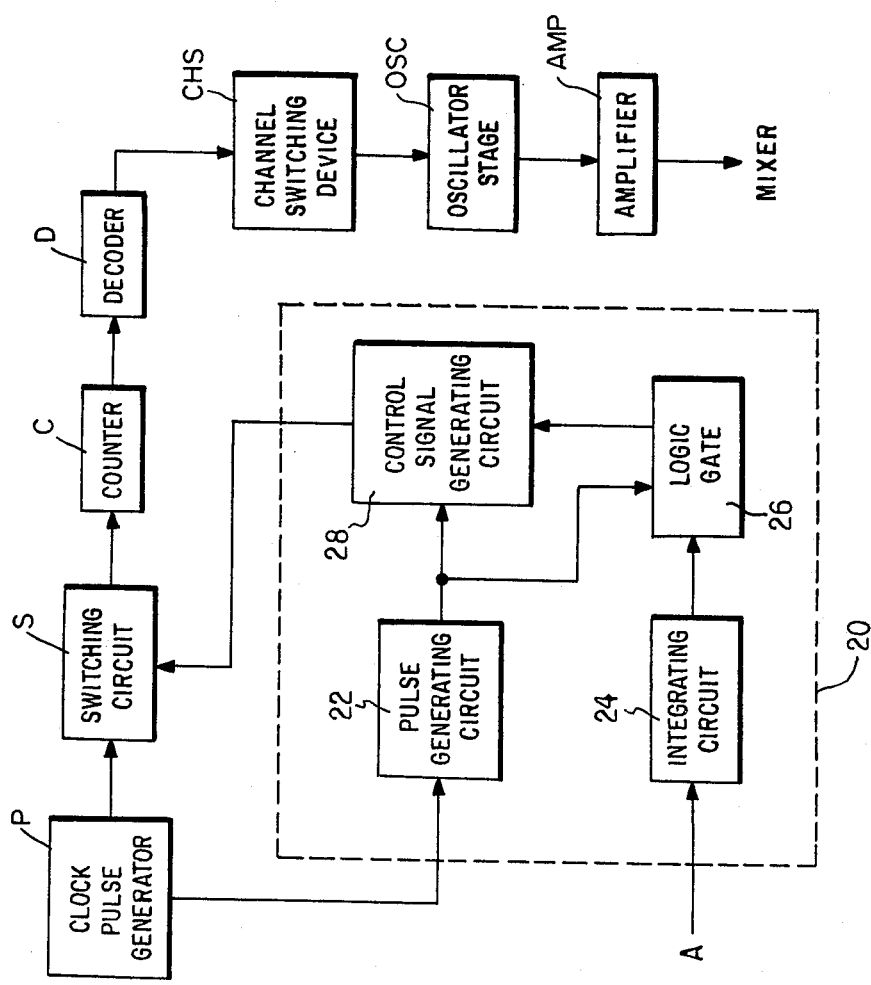
FIG. 2 is a block diagram of illustrative circuitry in accordance with the invention.

Reference should first be made to FIGS. 1 and 2. The block labelled FIG. 2 in FIG. 1 corresponds to FIG. 2 of the drawing. In FIG. 2 a channel switching device CHS is scanned by decoder D to incrementally vary the frequency of a local oscillator signal applied to an input mixer 100. The frequency of a carrier signal applied to a modulator 102 is also incrementally varied at this time. If channel 2, for example, is receiving a signal at an antenna 104, the received signal is eventually mixed with the local oscillator signal from FIG. 1 corresponding to channel 2. At this time an I-F signal is generated which falls within the pass band of an I-F amplifier 106. The modulated I-F signal is detected by a detector 108, the detected signal then being amplified by an amplifier 110 and applied to a loud speaker 112, for example. The output from detector 108 is also applied to a pulse forming circuitry 114 (which may be a squelch circuit) to form pulse Ps, for example, shown at ⑤ in FIG. 4. (The pulse forming circuit could also be connected to the output of I-F amplifier 106.) This pulse is then applied as sensing signal A to integrating circuit 24 of FIG. 2. The detection of signal A stops the scanning of the communication channels so that communication can take place on channel 2. The carrier signal for channel 2 is modulated by an audio signal, for example, applied to a microphone 116 and amplified by an amplifier 118. The modulated carrier wave is then amplified by an amplifier 120 and radiated from an antenna 122.

In the above embodiment, the system is so designed that the scanner stops when an active channel is located. The system could also be arranged to generate a sensing signal A each time a vacant channel is located. This latter situation would arise whenever a vacant channel in which to communicate must be located.

In FIG. 2, there is shown an overall block diagram of illustrative apparatus including a clock pulse generating circuit P typically comprising an unstable multivibrator or the like which generates clock pulses during the station selecting operation. A switching circuit S is switched ON and OFF depending on the occurrence of a sensing signal A so that the clock pulses generated by the clock pulse generating circuit P pass through or are blocked by the switching circuit. Sensing signal A, in accordance with an important aspect of the invention is discriminated from noise and the like by a signal discriminating circuit 20, which will be described in further detail hereinafter.

A counter C counts the clock pulses which pass through switching circuit S. A decoder D generates scanning pulses for scanning the plurality of communication channels. A channel switching CHS circuit may include a plurality of oscillation circuits each including a quartz oscillation element or the like for generating an output signal for transmission and/or reception in each channel. Switching circuit CHS is sequentially operated by the scanning pulses from decoder D. Also provided are an oscillation stage OSC, and an amplifier AMP. A more detailed description of an illustrative switching circuit CHS, oscillation stage OSC and amplifier AMP for a transmitting-receiving system is given in the before-mentioned co-pendng application, the latter circuitry not being a part, as such, of the present invention. The output signal from AMP is applied to mixing circuitry to thereby effect the desired, conventional transmission and/or reception.

Before describing the signal discriminating circuit 20 in detail, the operation of the automatic station selecting circuitry associated with the signal discriminating circuit 20 will be described. First it is assumed that the output from circuit 20 is HIGH (hereinafter H) when a sensing signal A is applied thereto, and LOW (hereinafter L) when no sensing signal is present. In the latter case, where the output from circuit 20 is L, switching circuit S is turned ON thereby applying the clock pulses from pulse generating circuit P to counter C. In counter C, the clock pulses are counted so that scanning pulses are generated by decoder D which sequentially scan the plurality of communication channels controlled by channel switching circuit CHS. The different frequency signals for each channel are thus delivered sequentially to the oscillation stage OSC, amplifier circuit AMP, and then to the mixing circuitry.

When a sensing signal A is applied to circuit 20, switching circuit S is turned OFF blocking clock pulses from pulse generating circuit P, whereby the scanning operation of the channel switching circuit CHS is stopped at the oscillation element circuit corresponding to the sensing signal making the channel available for communication and turning switching circuit S OFF. When the sensing signal terminates, the switching circuit S is again turned ON whereby clock pulses are again gated to counter C so that the scanning operation of the channel switching circuit CHS recommences. The scanning operation continues until another channel having a sensing signal A corresponding thereto is detected.

Summarizing the above description, the automatic station selecting device automatically scans the plurality of channels sequentially, terminates the scanning operation at a channel having a sensing signal thus permitting transmission and/or reception in the channel.

The signal discrimination circuitry and method utilized in the present invention will now be generally described with respect to FIG. 2. A pulse generating circuit 22 generates a pulse signal having a predetermined period and pulse width in response to each clock pulse generated by clock pulse generating circuit P. Pulse generating circuit 22 may comprise a monostable multivibrator which generates a pulse at each tailing edge of the clock pulses. An integrating circuit 24 integrates sensing signal A during a period corresponding to the pulse signal generated by pulse generating circuit 22, as will be described in more detail hereinafter. A logic gate 26 has applied thereto the integrated signal from circuit 24 and the pulse signal from pulse generating circuit 22. The output from logic circuit 26 depends on whether the integrated signal reaches a threshold level or not thereby discriminating the sensing signal A from noise. A control signal generating circuit 28 is responsive to the output signal from logic gate 26 and generates a control signal. Control signal generating circuit 28 may comprise a JK flip-flop or any other kind of flip-flop having an operational function similar to a JK flip-flop or a monostable multivibrator which can be retriggered. The control signal produced by circuit 28 is applied to the switching circuit S, as described before, thus controlling the scanning operation of the channel switching circuit CHS.

Figure 3:
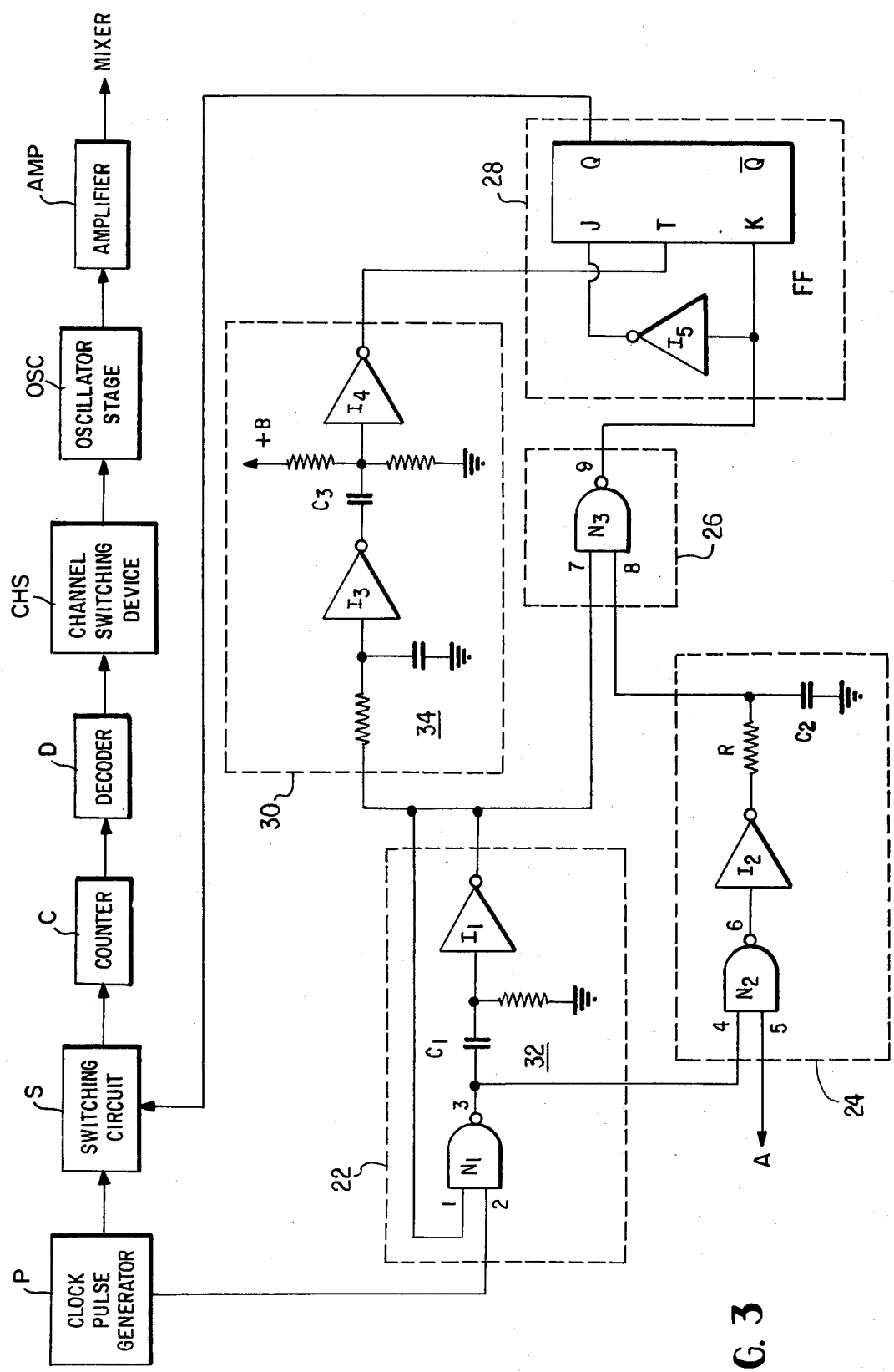
FIG. 3 is a schematic diagram of the circuitry of FIG. 2.

The operation of signal discriminating circuitry 20 will now be described in more detail with respect to FIGS. 3 and 4. In FIG. 3, like parts as in FIG. 2 are designated by like reference numerals and detailed descriptions thereof are omitted. In FIG. 3, a NAND gate N1 in the pulse generating circuit 22 receives the clock pulses from clock pulse generating circuit P, and the output of NAND gate N1 is on one hand applied to an inverter $I_1$ through a differentiating circuit 32 including a capacitor C1 and on the other hand to another NAND gate N2 in integrating circuit 24. Capacitor C1 in differentiating circuit 32 has a high value of capacitance. Sensing signal A is applied to another input of NAND gate N2. The output of NAND gate N2 is applied through an inverter $I_2$ to an integrating circuit comprising a resistor R and a capacitor C2. The output of the integrating circuit is applied to a NAND gate N3 comprising logic gate 26. To the other input of NAND gate N3, the output of inverter $I_1$ is applied. The output of NAND gate N3 is applied simultaneously to the K input of a JK flip-flop FF in control signal generating circuit 28 and to the J input of the same flip-flop through an inverter $I_5$. Inverters $I_3$ and $I_4$ constitute a pulse forming circuit 30 for reshaping the waveform of the output pulses from control signal generating circuit 22 to thereby obtain a clock pulse which is applied to the T terminal of JK flip-flop FF. The Q output of the JK flip-flop FF is applied to switching circuit S for ON-OFF controlling the clock pulses from generator P.

The operation of signal discriminating device 20 will now be explained with reference to the timing charts of FIG. 4 where the number adjacent each timing chart corresponds to the terminal of the same number on the circuit diagram of FIG. 3. The clock pulses generated from clock pulse generating circuit P have a period corresponding to one channel which may be 50 ms, for example. The pulses thus respectively corresponding to the plurality of communication channels are sequentially applied to input 2 of NAND gate N1. The clock pulses shown at 2 in FIG. 4 are inverted in NAND gate N1 and formed by large capacitor C1 into a pulse signal having pulse widths of 40 ms at the H level and 10 ms at the L level as shown at 3. The pulse signal thus formed is inverted by inverter $I_1$ to provide the signal shown at 7 in FIG. 4 which occurs at input 7 of NAND gate N3.

Figure 4:
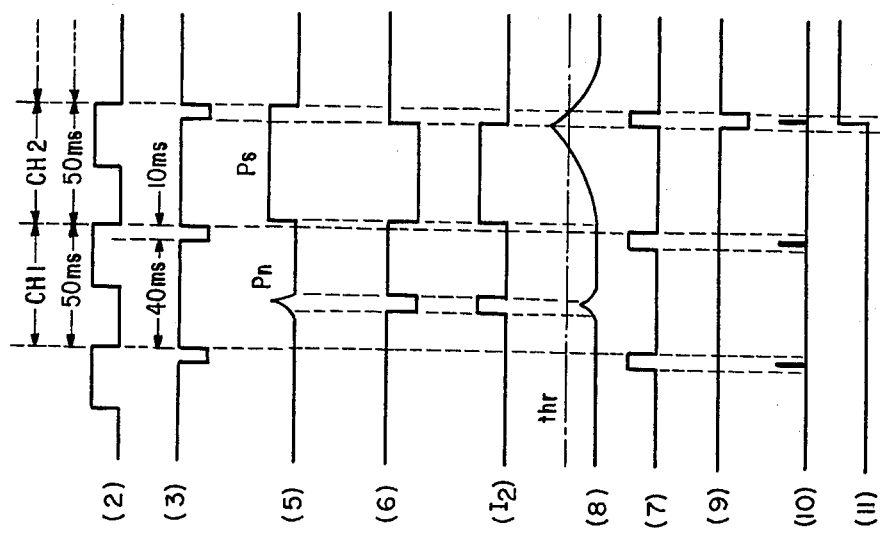
FIG. 4 illustrates typical waveforms occurring at different terminals of the circuitry of FIG. 3.

Assume that the signal, as shown at 5 in FIG. 4, comprises, for the first and second channels, a noise signal Pn having a pulse width of about 10 ms for the first channel and a sensing signal Ps having a pulse width of about 45 ms for the second channel. The signal occurring at 5 in FIG. 4 corresponds to the sensing signal A. This signal is applied to input terminal 5 of NAND gate N2 of integrating circuit 24, the inputs to NAND gate N2 cause the output of the NAND gate to be as shown at 6 in FIG. 4. The output signal 6 is inverted by inverter $I_2$ as shown at $I_2$ in FIG. 4 and then integrated by R and C2 as shown by 8 in FIG. 4. The integrated signal is applied to NAND gate N3 where it is determined whether it is higher or lower than a threshold level thr as shown in 8. As a result of the discrimination by NAND gate N3, an output signal as shown in 9 is obtained from NAND gate N3 in response to input signals 7 and 8. The values of resistor R and capacitor C2 of the integrating circuit may be so selected that sensing pulses having a duration longer than about 30 ms cause the threshold value to be exceeded.

Thus, since noise pulse Pn in input signal 5 has a pulse width of about 10 ms, it cannot cause the threshold value thr to be exceeded as is shown at 8 in FIG. 4.

The signal level at that part of the output signal 9 is not changed. On the other hand, pulse Ps has a duration longer than 30 ms, and hence the output signal from the integrator exceeds the threshold lever thr whereby NAND gate N3 produces an output signal 9 comprising a pulse of about 10 ms pulse width. In other words, output signal 9 is obtained only when a sensing signal having a duration longer than 30 ms is applied to NAND gate N2 and pulses having durations in the range from 10 to 20 ms for example, such as noise, are eliminated from the output of NAND gate N3.

The above described discrimination of input pulses is carried out within 40 ms as is apparent at 3 in FIG. 4. It should be noted that when the sensing pulse has a duration substantially exceeding the 40 ms, the portion exceeding 40 ms is discarded as noise signal, and thus discrimination of the sensing signal is always completed within 40 ms.

The output signal 9 thus discriminated is applied to the K terminal of JK flip-flop FF and also to the J terminal through inverter I5, thus placing JK flip-flop FF in its set state when a clock pulse is applied to the T terminal thereof. If the timing of the trailing edges of the J and K inputs coincides with that of the leading edge of the T input, the Q output of flip-flop FF becomes unstable. For this reason, the pulse width of the clock pulses applied to the T terminal should be shortened and the occurrence of the clock pulses should be somewhat delayed as shown at 10. In order to obtain the clock pulses as shown at 10, the output signal 7 from inverter $I_1$ is integrated by integrating circuit 34 and somewhat delayed by inverter $I_3$. The output of inverter $I_3$ is applied to capacitor C3 thereby converting it into a pulse having a pulse width of about 2 to 3 ms, this being effected by the charging and discharging of capacitor C3. The pulse thus obtained is inverted by inverter $I_4$ so that a clock pulse as shown in 10 is obtained.

When the clock pulse 10 and the pulse 9 are applied to the T and K terminals of flip-flop FF, the flip-flop is placed in its set state. The Q output is thus at the H level as shown at 11 in FIG. 4 and turns switching circuit S OFF thereby blocking the clock pulses generated by clock pulse generating circuit P. In this state, the station selecting circuitry allows transmitting and/or receiving in the second channel.

As communication in the second channel continues, the sensing signal will, of course, be longer than the 45 ms of Ps in the foregoing example. However, JK flip-flop FF is not reset because output 9 and clock pulses 10 are applied to the appropriate terminals of flip-flop FF every 40 ms whereby the flip-flop is maintained in its set state. In other words, the noise and other pulses removed by the signal discriminating device of this invention are those typically having pulse widths less than 30 ms, and hence noises ordinarily occurring in the circuit can be removed completely. The reason why the discrimination pulse width is selected as 30 ms is that too short a pulse width makes it difficult to discriminate normal signals from noises and thus noise signals having somewhat longer durations could exceed the threshold. The 30 ms duration is considered to be preferable from experiments that have been conducted.

Typical, but not limiting values of resistor R and capacitors C1, C2, and C3 are as follows:
R = 470 Ω
$C_1 = 100$ μF
$C_2 = 10$ μF
$C_3 = 0.47$ μF The advantageous features of the present invention are thus as follows:
1. Impulsive noise having a duration less than a preset value, 30 ms, for example, can be completely eliminated.
2. Since any possibility of erroneous operation due to noise is eliminated, erroneous sensing signals are not generated, and hence erroneous operations of the transmitter and/or receiver can be eliminated.
3. The invention may be applied to transmitter and receiver circuits and also to various receivers such as FM and television receivers.

What is claimed is:

1. A multichannel communication system having a station selecting device, said station selecting device comprising
    information signal receiving means for receiving information signals over at least one of a plurality of channels;
    means for generating a train of first pulses of predetermined width and period;
    first signal generating means responsive to said train of first pulses for automatically, sequentially generating a plurality of first signals respectively corresponding to the information signals of said plurality of channels of said information signal receiving means;
    said information signal receiving means including means responsive to said plurality of first signals and said information signals to generate a respective plurality of intermediate frequency signals, the frequencies of said intermediate frequency signals being a predetermined difference between said first signals and the information signals;
    sensing signal generating means responsive to said intermediate frequency signals for generating a sensing signal for each of said channels;
    means for integrating said sensing signal; and
    threshold means for generating a control signal to stop said first signal generating means by blocking the application of said train of first pulses to said first signal generating means in response to said first pulses and the integrated sensing signal whenever the sensing signal exceeds the threshold of said threshold means during the occurrence of one of said first pulses
    whereby the sensing signals are normally discriminated from noise signals since the latter signals, when integrated, do not exceed said threshold during the occurrence of said first pulses.

2. A device as in claim 1 where said threshold means includes a logic gate responsive to said first pulses and the integrated sensing signal and a bistable storage device responsive to said logic gate for generating said control signal.

* * * * *